United States Patent [19]
Ogawa et al.

[11] Patent Number: 5,372,916
[45] Date of Patent: Dec. 13, 1994

[54] X-RAY EXPOSURE METHOD WITH AN X-RAY MASK COMPRISING PHASE SHIFTER SIDEWALLS

[75] Inventors: Taro Ogawa, Kodaira; Kozo Mochiji, Hachioji; Seiichi Murayama; Hiroaki Oizumi, both of Kokubunji; Takashi Soga, Hachioji; Seiji Yamamoto, Kokubunji; Isao Ochiai, Otsuki, all of Japan

[73] Assignee: Hitachi, Ltd., Tokyo, Japan

[21] Appl. No.: 909,309

[22] Filed: Jul. 6, 1992

[30] Foreign Application Priority Data

Sep. 12, 1991 [JP] Japan .................................. 3-232944

[51] Int. Cl.$^5$ .............................................. G03C 5/00
[52] U.S. Cl. ........................................ 430/321; 430/5; 430/270; 378/34; 378/35
[58] Field of Search ..................... 430/5, 270, 321, 324, 430/311; 378/34, 35

[56] References Cited
FOREIGN PATENT DOCUMENTS 2-52416  2/1990  Japan .

OTHER PUBLICATIONS

Japanese Journal Microelectronic Engineering–vol. 9 (1989) pp. 127–130.
Optical Systems for Soft X–rays, 1986, pp. 3–7.
Proceedings AIB Conference p. 340.
Yamashita et al, ("0.2 μm or Less i-Line Lithography by Phase–Shifting–Mask Technology", IEEE, 1990, pp. 33.3.1–33.3.4).

*Primary Examiner*—Steve Rosasco
*Attorney, Agent, or Firm*—Antonelli, Terry, Stout & Kraus

[57] ABSTRACT

In an X-ray exposure method, consideration was made to application of a concept of a phase shift method which is used for a light exposure method, in order to improve the resolution. As a result, phase shift layers made of a material having an appropriate refractivity are provided on side walls of an absorbing pattern of an X-ray mask to improve the resolution by an interference effect. One or more layers made of a material having a refractivity different from that of the absorbing pattern are formed on the side walls of the absorbing pattern of the X-ray mask.

9 Claims, 4 Drawing Sheets

F I G. 3a
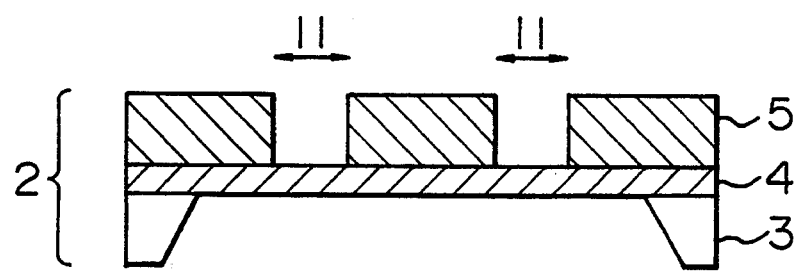
F I G. 3b
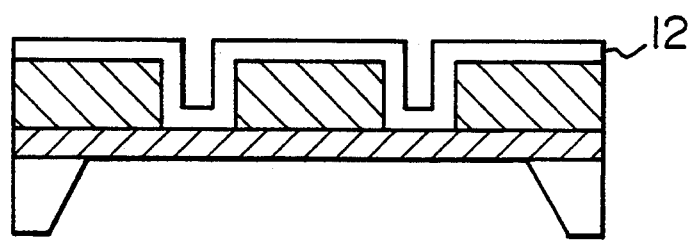
F I G. 3c
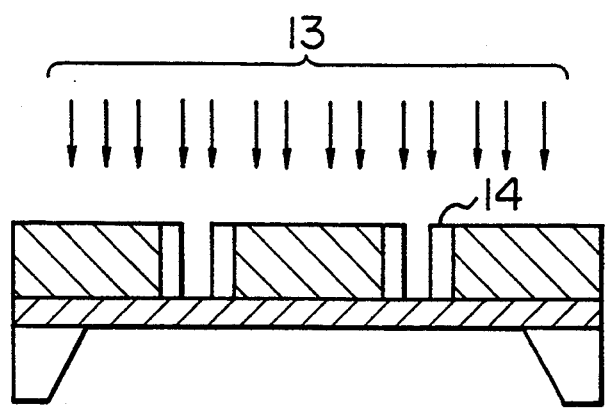

F I G. 5
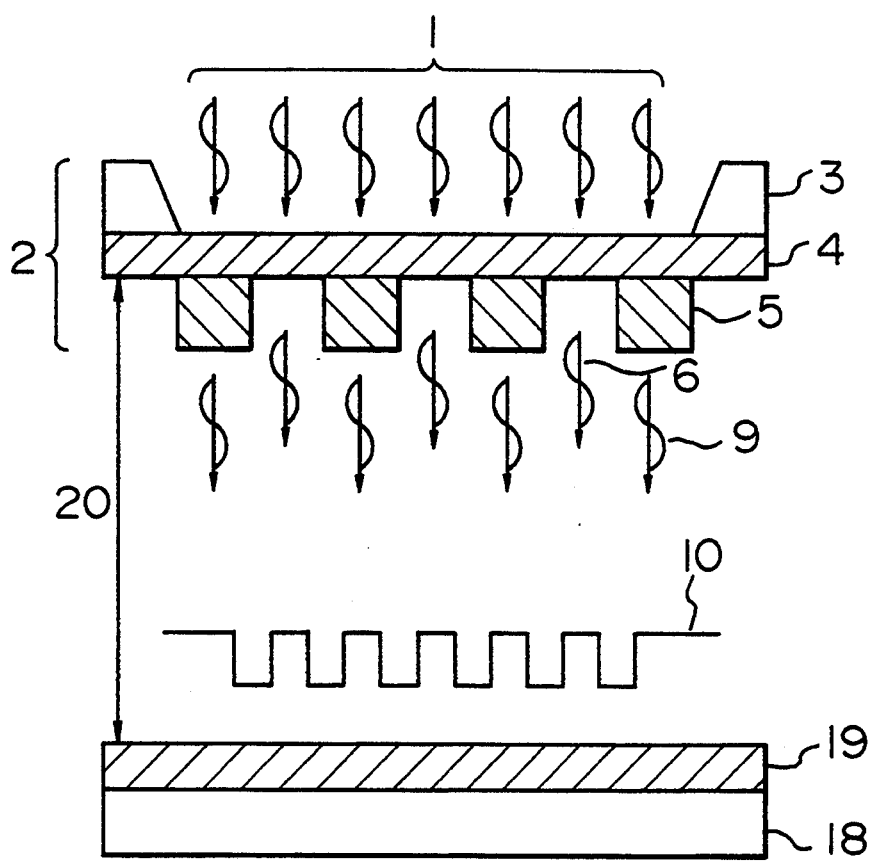

X-RAY EXPOSURE METHOD WITH AN X-RAY MASK COMPRISING PHASE SHIFTER SIDEWALLS

BACKGROUND OF THE INVENTION

The present invention relates to a method of manufacturing a semiconductor device, and more particularly to an X-ray exposure method for transferring mask patterns onto a substrate by using a soft X-ray.

The X-ray exposure method is a semiconductor manufacturing process in which a mask consisting of an X-ray transmissible support film and absorbing patterns is irradiated with soft X-rays to transfer desired patterns onto a substrate by light transmitted through the mask. Since the soft X-ray has a wavelength two orders of magnitude shorter than an ultraviolet light which is used for a conventional light exposure method, it can reduce the influence of Fresnel diffraction and obtain a high resolution.

However, even with the X-ray exposure method, the influence of Fresnel diffraction causes deterioration in resolution in a sub-micron region. For this reason, for example, as discussed in "Micrelectronic Engineering", vol. 9, pp. 127-130, 1989 by Hasegawa et al, and JP-A-2-52416, trials have been made for improving the resolution by utilizing an interference effect of X-rays. These trials are featured by working side walls of an absorbing pattern 5 which has conventionally been rectangular as shown in FIG. 1a to a tapered shape 8 or the like as shown in FIG. 1b in order to change a optical path length of an X-ray. As a result, the phase of an X-ray 9 transmitted through the side walls of the absorbing pattern is advanced with respect to an X-ray 6 from an ordinary transmitting portion and interferes with expansion of an exposure intensity of the X-ray 6 due to Fresnel diffraction, whereby a distribution of exposure intensity by the transmitted X-rays is made abrupt, thereby making it possible to achieve the improvement of resolution.

In commonly assigned U.S. application Ser. No. 07/593808, filed Oct. 5, 1990, a technique is disclosed wherein, after forming a light shield film having a predetermined shape on a glass substrate, a flattening layer for flattening a difference in level of the light shield film, and a phase shifter is formed thereon.

SUMMARY OF THE INVENTION

The exposure methods proposed in the foregoing two documents enable the improvement of the resolution by working the side walls of the absorbing pattern to a tapered shape or the like. However, they are not exactly suitable to working side walls of an absorbing pattern in sub-micron dimension to an arbitrary shape.

According to one aspect of the present invention, one or more layers made of a material have a different refractivity from that of an absorbing pattern on side walls of the absorbing member pattern.

Assuming in the present invention that n represents the refractivity of the layers formed on the side walls of the absorbing pattern with respect to a soft X-ray with a wavelength $\lambda$, and $\mu$ a ray absorbing coefficient, n and $\mu$ are given by the following equations, respectively, as shown in "Optical Systems for Soft X-rays", edited by A. G. Mischette, Plenum Press, pp. 3-7, (1986), and "Proceeding AIP Conference", edited by B. L. Henke et al, page 340:

$$n = 1 - \delta - i\beta \tag{1}$$

$$\mu = 4\pi\beta/\lambda \tag{2}$$

where
$\delta = N r_e \lambda^2 f_1 / 2\pi$ $\beta = N r_e \lambda^2 f_2 / 2\pi$ N: Number of constituent atoms of the layers formed on the side walls in a unit volume;

$r_e$: Effective electron radius; and $f_1$, $f_2$: Real part and imaginary part of atomic scattering factor for the constituent atoms of the layers formed on the side walls.

Thus, assuming that t represents a thickness of the layers formed on the side walls of the absorbing member; $I_0$ the intensity of an exposing X-ray; $\phi$ phase shift of the X-ray after transmitted through the layers formed on the side walls; and I the intensity of the X-ray, $\phi$ and I are given by the following equations:

$$\phi = 2\pi \delta t / \lambda \tag{3}$$

$$I = I_0 \exp(-\mu t) \tag{4}$$

Thus, since the X-ray which has been transmitted through the layers formed on the side walls of the absorbing pattern has the phase advanced by $\phi$ and the intensity attenuated to $I/I_0$, enlargement of intensity profile caused by Fresnel diffraction from the ordinary transmitting portion is cancelled by an interference effect, thereby rendering it possible to make abrupt an exposure intensity profile of the mask transmitted light. Particularly, by virtue of the phase of the X-ray after transmitted through the layers formed on the side walls which is advanced by an integer multiple of a half wavelength of the phase of the X-ray which has been transmitted through the ordinary portion, the effect of interference becomes larger. Further, if the intensity of enlarged portion by the diffraction of the X-ray which has been transmitted through the ordinary transmitting portion is equal to the intensity of the X-ray which has been transmitted through the layers on the side walls and the phase of which is advanced by an integer multiple of a half wavelength, given by the equations (3) and (4), the interference effect becomes larger. In addition, the present invention can be implemented by employing an undulator radiation, an X-ray laser, a plasma X-ray source or the like, which exhibits a good coherency, for an X-ray source.

The layers formed on the side walls of the absorbing member can be readily formed by a chemical vapor growth method, a vapor deposition method, an epitaxy method, a coating method, or lamination of an organic thin film such as a Langmuir-Blodgett film or the like. It is also possible to constitute the layer of elements, the atomic numbers of which are from 4 to 82, such as beryllium, boron, silicon, titanium, tantalum, tungsten, or the like, their compounds, and hydride, carbide, nitride, oxide, and so forth. Also, the refractivity of this layer can be changed by changing constituent materials and their composition. Further, the phase of the transmitted X-ray 9 can be changed in the width direction by laminating a layer 14 having a different refractivity, as shown in FIG. 2.

BRIEF DESCRIPTION OF THE DRAWINGS

FIGS. 3a, 3b and 3c are schematic cross-sectional view showing an X-ray exposure method according to one embodiment of the present invention.

FIG. 5 is a schematic cross-sectional view showing an X-ray exposure method according to a further embodiment of the present invention.

DESCRIPTION OF THE EMBODIMENTS

Figure 1A:
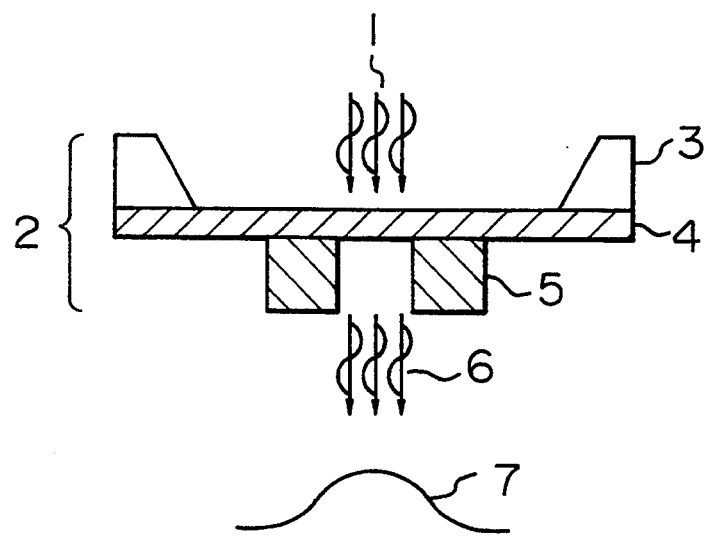
FIGS. 1a, 1b are schematic cross-sectional view for explaining a prior art proposal.
Figure 1B:
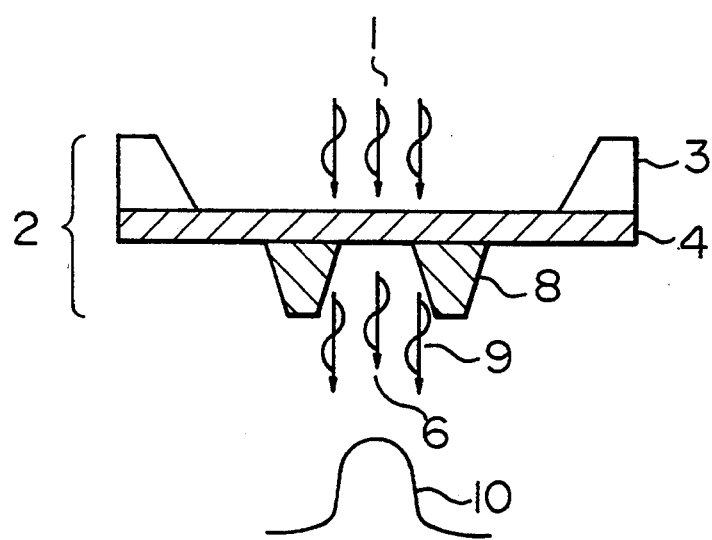
Figure 2:
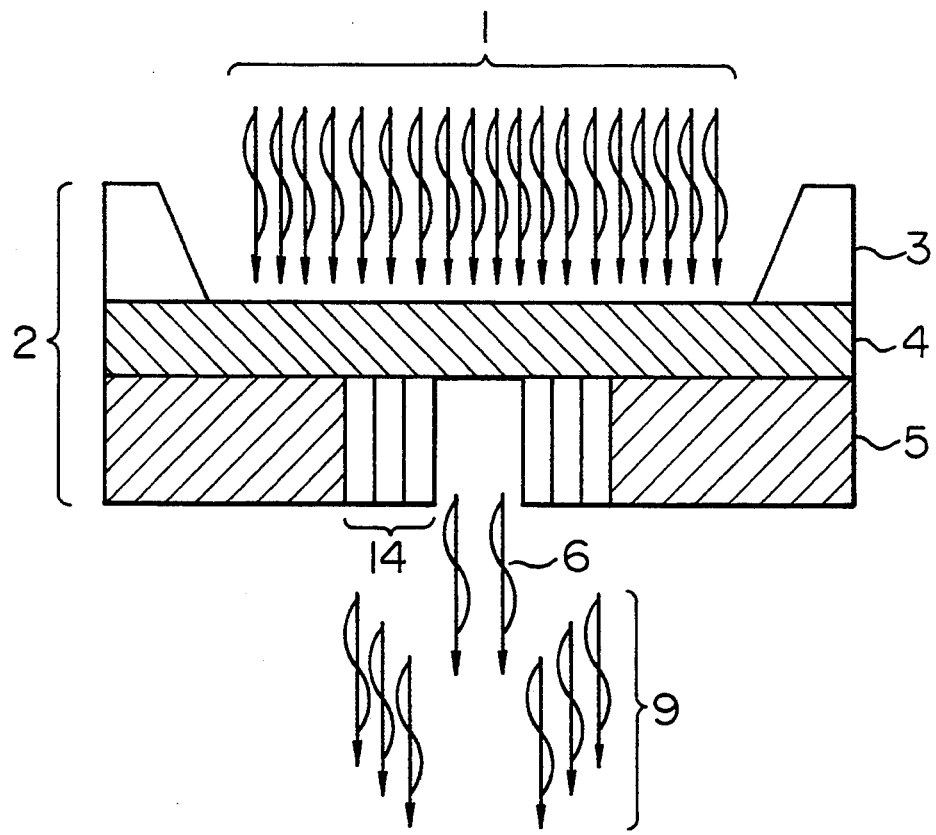
FIG. 2 is a schematic cross-sectional view for explaining the principle of the present invention.

As shown in FIG. 3a, an X-ray mask 2 includes a silicon nitride film 4 having a thickness of 3 $\mu$m and a tungsten absorbing pattern 5 with a thickness of 0.7 $\mu$m where transmitting portions having a line width of 0.35 $\mu$m are aligned. Next, as shown in FIG. 3b, after laminating a tantalum oxide film 12 in a thickness of 0.125 $\mu$m on the X-ray mask 2 by a chemical vapor deposition method or an oblique incident sputtering, argon ions 13 are radiated to remove the laminated tantalum oxide film 12 other than that on side walls of the absorbing pattern 5, as shown in FIG. 3c, thereby forming side wall layers 14 having a width of 0.125 $\mu$m.

Figure 4:
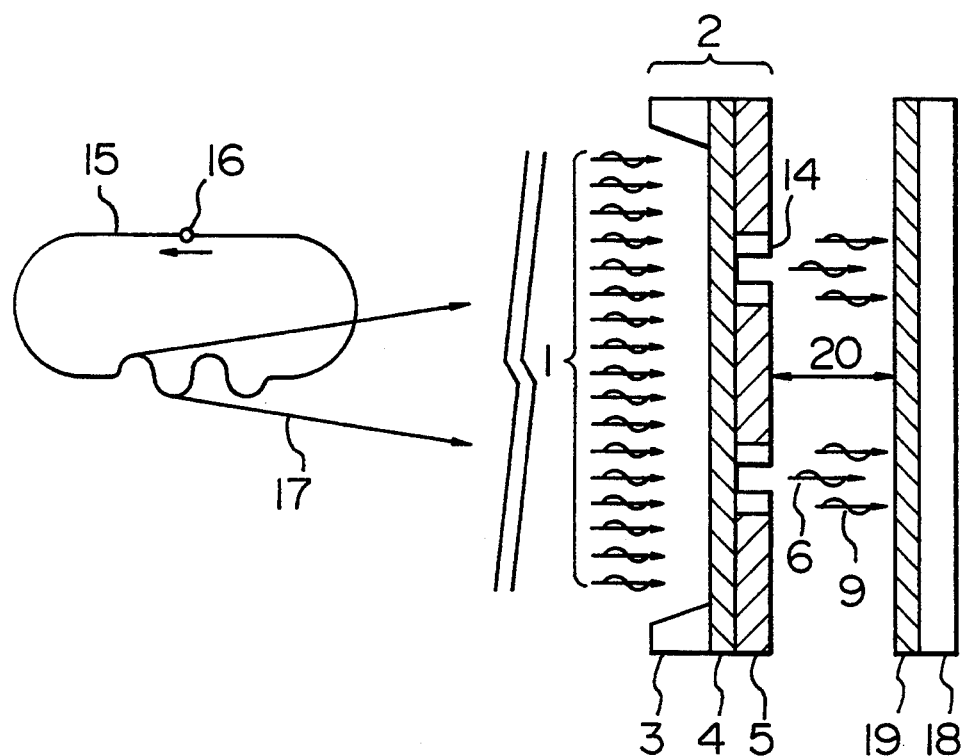
FIG. 4 is a schematic cross-sectional view showing an X-ray exposure method according to another embodiment of the present invention.

Next, as shown in FIG. 4, an exposing X-ray 1 exhibiting good coherency and having a wavelength of 1.2 nm, from an undulator radiation 17, is used to transfer the absorbing pattern 5 onto a wafer 18 on which a resist 19 of 1 $\mu$m in thickness is coated under the condition that a gap 20 is 10 $\mu$m. As a result, the X-ray 9 which has been transmitted through the side wall layers 14 formed on the side walls has the phase advanced by a half wavelength, and an exposure intensity distribution is made abrupt, so that a resist pattern obtained after development is a rectangular shaped one with a line width of 0.1 $\mu$m and an aspect ratio of 10. Incidentally, the tantalum oxide film 12 laminated other than on the side walls of the absorbing pattern 5 has a thickness of 0.125 $\mu$m, i.e., it is so thin and absorbs so few X-ray that exposure of the X-ray is possible even if it is not removed.

In FIG. 3b, the composition of a tantalum oxide film 12 is successively changed from Ta to $Ta_2O_5$ by a chemical vapor deposition method to perform a lamination over an entire X-ray mask 2 in a thickness of 0.125 $\mu$m. Further, as shown in FIG. 3c, the tantalum oxide film 12 laminated other than on side walls of an absorbing pattern 5 by radiation of argon ions 13 forms side wall layers 14.

Next, a soft X-ray having a wavelength of 1.2 nm is used for an exposing X-ray 1 to transfer the absorbing patterns 5 onto a wafer 18 coated with a resist 10 having a thickness of 1.5 $\mu$m under the condition that a gap 20 (FIG. 4) is 15 $\mu$m. As a result, a soft X-ray 9 which has been transmitted through the side wall layers 14 formed on the side walls has the phase successively advanced from 0 to a half wavelength, and an exposure intensity distribution is made abrupt, which results in obtaining, after development, resist patterns in a rectangular shape with a line width of 0.1 $\mu$m and an aspect ratio of 10.

In another embodiment, exposure is performed by using an X-ray mask having an absorbing pattern consisting of only a side wall layer 14 such that the phase of an X-ray 9 transmitted therethrough is advanced by an integer multiple of a half wavelength to perform a pattern formation in a cycle double the mask pattern.

In FIG. 5, an X-ray mask 2 includes a silicon nitride film 4 having a thickness of 3 $\mu$m and an absorbing pattern 5 made of silicon with a thickness of 1.6 $\mu$m and a line width of 0.1 $\mu$m at pitches of 0.2 $\mu$m. Next, a soft X-ray having a wavelength of 1.0 nm is used for an exposing X-ray 1 to transfer the absorbing pattern 5 onto a wafer 18 coated with a resist 19 having a thickness of 1.0 $\mu$m under the condition that a gap 20 is 10 $\mu$m. As a result, an X-ray 9 which has been transmitted through the absorbing pattern 5 has the phase advanced by a half wavelength, and the phase is reversed on the boundary with an X-ray 6 from an ordinary transmitting portion to cancel the intensity, whereby the light transmitted through the mask presents an exposure intensity distribution 10 having a pitch double the absorbing pattern 5, which results in obtaining a rectangular line/space shape having an aspect ratio of 10 at intervals of 0.1 $\mu$m.

According to the above described embodiments of the present invention, in the X-ray exposure method, the improvement of resolution made by the interference effect of X-rays can be realized by a simple method.

More specifically, the X-ray 9 which has been transmitted through the side wall layers 14 formed on the side walls has the phase advanced, so that interference arises with the transmitted X-ray 6 from the ordinary portions. As a result, the exposure intensity distribution 10 of the light transmitted through the X-ray mask is made abrupt, thereby achieving the improvement of resolution of a transfer pattern.

We claim:

1. An X-ray exposure method in which an X-ray lithography mask having an X-ray transmissible support film and a patterned X-ray absorbing film formed on said support film and representing a pattern carried by the mask is irradiated with X-rays to transfer said pattern on a substrate by transmitted X-rays, said X-ray absorbing film having a side wall, wherein said mask has a phase shifting film structure formed on said side wall of said patterned X-ray absorbing film having a refractive index different from a refractive index of said X-ray absorbing film.

2. An X-ray exposure method according to claim 1, wherein said phase shifting film structure is a multi-layered structure including a plurality of phase shifting films having refractive indices different from each other.

3. An X-ray exposure method according to claim 2, wherein each of said plurality of phase shifting films is made of an element having an atomic number between 4 to 82, a compound of said element, a hydride of said element, a carbide of said element, a nitride of said element, or an oxide of said element.

4. An X-ray exposure method according to claim 1, wherein the layers formed on the side walls of the absorbing patterns have a rectangular or tapered shape.

5. An X-ray exposure method according to claim 1, wherein said phase shifting film structure is formed by a chemical vapor growth method, a vapor deposition method, an epitaxy method, a sputtering method or a lamination of organic films.

6. An X-ray exposure method according to claim 1, wherein X-rays which have been transmitted through said phase shifting film structure have a phase advanced an integer multiple of a half wavelength of the X-rays.

7. An X-ray exposure method according to claim 1, wherein an undulator radiation, an X-ray laser, a plasma X-ray source, exhibiting good coherency, is employed as a source for the X-rays.

8. An analyzing apparatus which employs the X-ray exposure method according to claim 1.

9. An X-ray exposure method according to claim 1, wherein said phase shifting film structure is fashioned as a single film.

* * * * *